(12) United States Patent
Bessho et al.

(10) Patent No.: US 8,692,341 B2
(45) Date of Patent: Apr. 8, 2014

(54) STORAGE ELEMENT AND STORAGE DEVICE

(75) Inventors: Kazuhiro Bessho, Kanagawa (JP); Masanori Hosomi, Tokyo (JP); Hiroyuki Ohmori, Kanagawa (JP); Yutaka Higo, Kanagawa (JP); Kazutaka Yamane, Kanagawa (JP); Hiroyuki Uchida, Kanagawa (JP); Tetsuya Asayama, Tokyo (JP)

(73) Assignee: Sony Corporation, Tokyo (JP)

( * ) Notice: Subject to any disclaimer, the term of this patent is extended or adjusted under 35 U.S.C. 154(b) by 134 days.

(21) Appl. No.: 13/332,664

(22) Filed: Dec. 21, 2011

(65) Prior Publication Data

US 2012/0175716 A1 Jul. 12, 2012

(30) Foreign Application Priority Data

Jan. 7, 2011 (JP) ................. 2011-001920

(51) Int. Cl.
*H01L 29/82* (2006.01)

(52) U.S. Cl.
USPC .......................... 257/421; 257/422

(58) Field of Classification Search
USPC ................ 257/421, 422
See application file for complete search history.

(56) References Cited

U.S. PATENT DOCUMENTS

| | | | |
|---|---|---|---|
| 6,256,223 B1 | 7/2001 | Sun | |
| 7,304,360 B2* | 12/2007 | Guo et al. | 257/422 |
| 7,652,852 B2* | 1/2010 | Maehara et al. | 360/313 |
| 7,660,153 B2* | 2/2010 | Yamane et al. | 365/171 |
| 7,869,272 B2* | 1/2011 | Yamane et al. | 365/171 |
| 7,999,360 B2* | 8/2011 | Hong et al. | 257/659 |
| 2003/0189234 A1* | 10/2003 | Johnson et al. | 257/421 |
| 2004/0150059 A1* | 8/2004 | Drewes | 257/421 |
| 2006/0038246 A1* | 2/2006 | Maehara et al. | 257/421 |
| 2007/0007610 A1* | 1/2007 | Saito et al. | 257/422 |
| 2007/0228501 A1* | 10/2007 | Nakamura et al. | 257/421 |
| 2007/0241410 A1* | 10/2007 | Umehara et al. | 257/379 |

(Continued)

FOREIGN PATENT DOCUMENTS

| | | |
|---|---|---|
| JP | 2003-017782 | 1/2003 |
| JP | 2008-227388 | 9/2008 |

OTHER PUBLICATIONS

S. Mangin et al.; Current-induced magnetization reversal in nanopillars with perpendicular anistropy; Nature Materials; vol. 5; Mar. 2006.

(Continued)

*Primary Examiner* — Yu-Hsi D Sun
*Assistant Examiner* — Grant Withers
(74) *Attorney, Agent, or Firm* — Dentons US LLP (57) ABSTRACT

A storage element includes: a storage layer which has magnetization perpendicular to a film surface, the direction of the magnetization being changed in accordance with information; a magnetization fixed layer which has magnetization perpendicular to a film surface used as a base of information stored in the storage layer; and an insulating layer of a nonmagnetic substance provided between the storage layer and the magnetization fixed layer. In the storage element described above, the magnetization of the storage layer is reversed using a spin torque magnetization reversal generated by a current flowing in a lamination direction of a layer structure including the storage layer, the insulating layer, and the magnetization fixed layer to store information, the storage layer is directly provided with a layer at a side opposite to the insulating layer, and this layer includes a conductive oxide.

9 Claims, 6 Drawing Sheets

(56) References Cited

U.S. PATENT DOCUMENTS

| | | | |
|---|---|---|---|
| 2008/0121945 A1* | 5/2008 | Saito | 257/252 |
| 2009/0079018 A1* | 3/2009 | Nagase et al. | 257/421 |
| 2009/0285017 A1* | 11/2009 | Yamane et al. | 365/171 |
| 2010/0044680 A1* | 2/2010 | Hong et al. | 257/37 |
| 2010/0301436 A1* | 12/2010 | Sashida | 257/421 |
| 2012/0018823 A1* | 1/2012 | Huai et al. | 257/421 |
| 2012/0280339 A1* | 11/2012 | Zhang et al. | 257/421 |
| 2012/0299134 A1* | 11/2012 | Jan et al. | 257/421 |
| 2013/0001715 A1* | 1/2013 | Yamakawa et al. | 257/421 |

OTHER PUBLICATIONS

L. Berger; Emission of spin waves by a magnetic multilayer traversed by a current; Physical Review B; vol. 54, No. 13; Oct. 1, 1996.

J. C. Slonczewski; Current-driven excitation of magnetic multilayers; Journal of Magnetism and Magnetic Materials 159; 1996; L1-L7.

* cited by examiner

| MATERIAL | RESISTIVITY [Ω·cm] |
|---|---|
| $ReO_3$ | $1 \times 10^{-5}$ |
| $RuO_2$ | $5 \times 10^{-5}$ |
| $SnO_2$ | $1 \times 10^{-2}$ |
| Nb-DOPED $TiO_2$ | $4 \times 10^{-3}$ |
| $LiTi_2O_4$ | $1 \times 10^{-3}$ |
| $LiV_2O_4$ | $1 \times 10^{-3}$ |
| $Fe_2O_4$ | $1 \times 10^{-2}$ |
| ZnO | $8 \times 10^{-3}$ |
| ITO (In-Sn-O) | $2 \times 10^{-4}$ |

STORAGE ELEMENT AND STORAGE DEVICE

BACKGROUND

The present disclosure relates to a storage element which has a plurality of magnetic layers and which performs recording using spin torque magnetization reversal and to a storage device.

Concomitant with significant development of various types of information apparatuses from mobile terminals to large scale servers, in elements, such as memory and logic elements, forming the above apparatuses, further improvements in performance, such as increase in degree of integration, increase in operation speed, and reduction in power consumption, have been pursued. In particular, the progress of semiconductor nonvolatile memories is remarkable, and flash memories each functioning as a large scale file memory have increasingly spread so as to push out hard disk drives from the market.

In addition, in order to replace NOR flash memories, DRAMs, and the like, which have been commonly used, development of a ferroelectric random access memory (FeRAM), a magnetic random access memory (MRAM), a phase-change random access memory (PCRAM), and the like has been carried out for code storage application and for further application to working memories. Some of those memories mentioned above have already started to be used in practice.

In particular, since the MRAM performs data storage using a magnetization direction of a magnetic substance, rewriting can be practically performed an approximately infinite number of times ($10^{15}$ times or more) at a high speed, and the MRAM has already been used, for example, in the fields of industrial automations and airplanes.

Because of the high-speed operation and reliability, the MRAM has been expected to be further used for code storage and working memory applications; however, in fact, reduction in power consumption and increase in capacity are subjects to be overcome. These are substantial subjects resulting from a recording principle of the MRAM, that is, resulting from a method for reversing magnetization by a current magnetic field generated from each wire.

As one method to overcome these subjects, recording independent of a current magnetic field, that is, a magnetization reversal method, has been investigated. In particular, researches on spin torque magnetization reversal have been actively performed (for example, see Japanese Patent Unexamined Application Publication Nos. 2003-17782 and 2008-227388, U.S. Pat. No. 6,256,223, Phys. Rev. B, 54, 9353 (1996), and J. Magn. Mat., 159, L1 (1996)).

A storage element of the spin torque magnetization reversal is frequently formed to have a magnetic tunnel junction (MTJ) structure as in the case of the MRAM.

In this structure, a phenomenon is used in which when a spin-polarized electron passing through a magnetic layer in which the magnetization is fixed in a certain direction enters another free magnetic layer (the direction of the magnetization is not fixed), a torque (this is referred to as "spin transfer torque") is imparted to the free magnetic layer, and when a current equivalent to or more than a certain threshold value is supplied, the magnetization of the free magnetic layer is reversed. Rewriting between "0" and "1" is performed by changing the polarity of the current.

An absolute value of the current for this reversal is 1 mA or less for an element having a scale of approximately 0.1 µm. Furthermore, since this current value decreases in proportion to the element volume, scaling can be performed. In addition, since a word line of the MRAM necessary to generate a current magnetic field for recording is not necessary, the cell structure can be advantageously simplified.

Hereinafter, an MRAM using the spin torque magnetization reversal is referred to as a spin torque-magnetic random access memory (ST-MRAM). In addition, the spin torque magnetization reversal may also be called spin injection magnetization reversal in some cases.

As a nonvolatile memory capable of realizing reduction in power consumption and increase in capacity while maintaining advantages of the MRAM, that is, a high operation speed and an approximately infinite number of times of rewriting, great expectations have been placed on the ST-MRAM.

Figure 7:
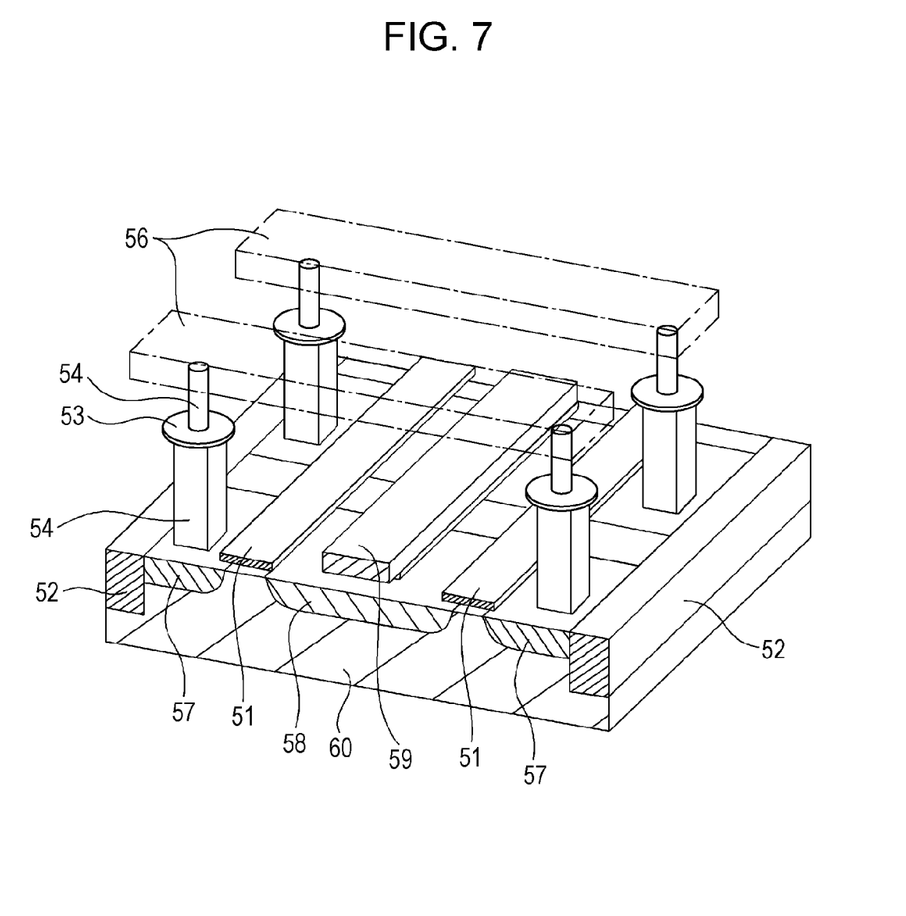
FIG. 7 is a perspective view of a schematic structure of a memory device using magnetization reversal by spin injection.
Figure 8:
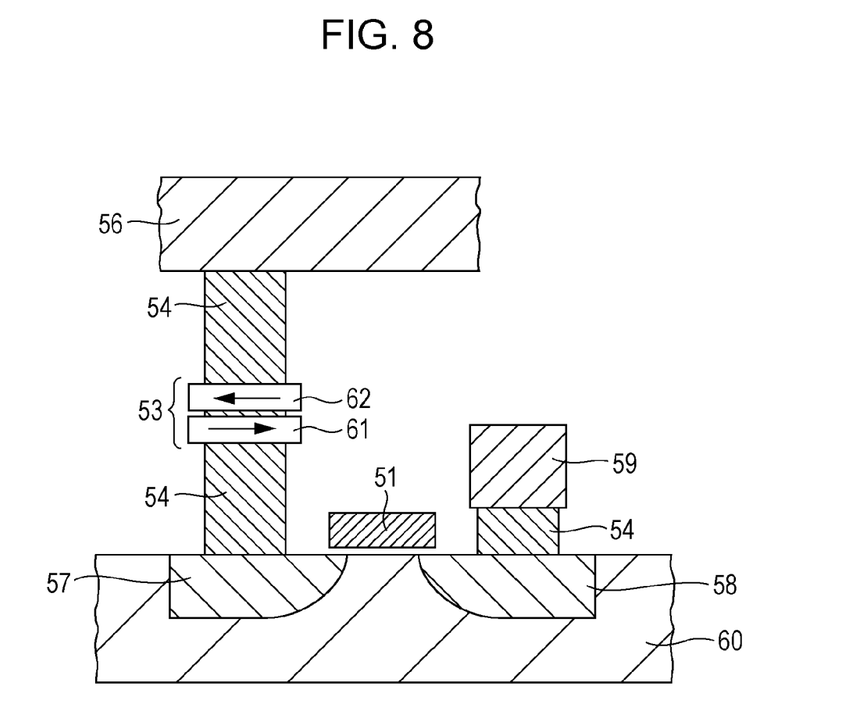
FIG. 8 is a cross-sectional view of the memory device shown in FIG. 7.

A schematic view of the ST-MRAM is shown in FIGS. 7 and 8. FIG. 7 is a perspective view, and FIG. 8 is a cross-sectional view.

In a portion of a semiconductor base 60, such as a silicon substrate, isolated by an element isolation layer 52, a drain region 58, a source region 57, and a gate electrode 51, which form a selection transistor for selecting each memory cell, are formed. Among those mentioned above, the gate electrode 51 also functions as a word line extending perpendicular to the plane of FIG. 8.

The drain region 58 is formed in common for selection transistors located at right and left sides in FIG. 7, and a wire 59 is connected to this drain region 58.

In addition, a storage element 53 which has a storage layer in which the direction of the magnetization is reversed by the spin torque magnetization reversal is arranged between the source region 57 and a bit line 56 arranged thereabove to extend in a right-to-left direction in FIG. 8.

This storage element 53 is formed, for example, of a magnetic tunnel junction element (MTJ element). The storage element 53 has two magnetic layers 61 and 62. Of the two magnetic layers 61 and 62, one magnetic layer is used as a magnetization fixed layer in which the direction of the magnetization is fixed, and the other magnetic layer is used as a magnetization free layer, that is, a storage layer, in which the direction of the magnetization is changed.

In addition, the storage element 53 is connected to the bit line 56 and the source region 57 with top and bottom contact layers 54, respectively, provided therebetween. Accordingly, when a current is allowed to flow in the storage element 53, the direction of the magnetization of the storage layer can be reversed by spin injection.

SUMMARY

Incidentally, in the case of the MRAM, writing wires (a word line and a bit line) are provided besides a storage element, and information is written (recorded) by a current magnetic field generated when a current is allowed to flow through the writing wires. Therefore, a current necessary for writing can be supplied to the writing wires.

On the other hand, in an ST-MRAM, it is necessary to reverse the direction of the magnetization of a storage layer by performing the spin torque magnetization reversal using a current flowing in a storage element. In addition, since writing (recording) of information is performed by a current directly supplied to the storage element as described above, in order to select a memory cell which performs writing, the storage element is connected a selection transistor to form the memory cell. As a result, the current flowing in the storage element is limited to a current which is allowed to flow in the selection transistor (saturation current of the selection transistor).

In particular, the writing current in the ST-MRAM is limited to the saturation current of the selection transistor or less.

Since it has been well understood that the saturation current of a transistor decreases as the miniaturization is advanced, in order to miniaturize the whole ST-MRAM, it is necessary to reduce the current flowing in the storage element by improving the efficiency of the spin transfer.

In addition, in order to increase the intensity of a reading signal, it is necessary to ensure a high rate of change in magnetoresistance, and for this purpose, the MTJ structure as described above can be effectively used, that is, a storage element in which an interlayer in contact with two magnetic layers is formed as a tunnel insulating layer (tunnel barrier layer) can be effectively used.

However, when the tunnel insulating layer is used as the interlayer as described above, in order to prevent dielectric breakdown of the tunnel insulating layer, a current supplied to the storage element is limited. That is, in order to ensure the reliability of the storage element against repeated writing, a current necessary for the spin torque magnetization reversal is also necessarily reduced.

The current necessary for the spin torque magnetization reversal may be called a reverse current, a recording current, or the like in some cases.

On the other hand, since the ST-MRAM is a nonvolatile memory, information written by a current is expected to be stably stored therein. That is, it is necessary to ensure the stability (thermal stability) of the magnetization of the storage layer against heat fluctuation.

The reason for this is that if the thermal stability of the storage layer is not ensured, the direction of reversed magnetization may be again reversed with heat (temperature in operating environment) in some cases, and thereby writing error may occur.

As described above, the storage element of the ST-MRAM is advantageous in scaling as compared to that of a related MRAM, that is, the volume of the storage layer of the ST-MRAM can be advantageously decreased in view of the recording current value. However, when the volume is decreased, if the other properties are not changed, the thermal stability is liable to be degraded.

Since the volume of the storage element is further decreased when the capacity of the ST-MRAM is increased, it becomes important to ensure the thermal stability.

In consideration of this point, the thermal stability is a very important property for the storage element of the ST-MRAM, and hence it is concluded that the ST-MRAM is necessarily designed to ensure this thermal stability even if the volume is decreased.

Accordingly, in order to use the ST-MRAM as an effective nonvolatile memory, it is necessary to reduce the reverse current used for the spin torque magnetization reversal to the saturation current of the transistor or less and to less than a current at which the tunnel barrier is destroyed and is also necessary to ensure the thermal stability to retain written information.

In order to reduce the reverse current and ensure the thermal stability at the same time, a structure using a perpendicular magnetic anisotropy film for the storage layer has attracted attention.

For example, according to Nature Materials., 5, 210 (2006), by using a perpendicular magnetic anisotropy film, such as a Co/Ni multilayer film, for the storage layer, the possibility of reducing the reverse current and ensuring the thermal stability at the same time is suggested.

For example, several types of magnetic materials having perpendicular magnetic anisotropy, such as rare earth-transition metal alloys (TbCoFe and the like), metal multilayer films (Co/Pd multilayer film and the like), ordered alloys (FePt and the like), and composite materials each using interfacial magnetic anisotropy between an oxide and a magnetic metal (Co/MgO and the like), may be mentioned. However, when the use of a tunnel junction structure for realizing a high rate of change in magnetoresistance is considered to obtain a large reading signal in the ST-MRAM, and when the heat resistant and an easy manufacturing process are also taken into consideration, the structure formed from a composite material which uses interfacial magnetic anisotropy, such as a laminate formed by laminating a magnetic material containing Co or Fe on MgO, which is a tunnel barrier, is promising.

However, the anisotropy energy of the perpendicular magnetic anisotropy based on the interfacial magnetic anisotropy is low as compared to that of the crystal magnetic anisotropy, the single ion anisotropy, and the like and is also disadvantageously liable to decrease as the thickness of the magnetic layer is increased.

In order to solve the problems described above, the present applicant investigates the structure in which oxides are arranged at two sides of a magnetic metal to increase the number of interfaces. This structure is formed to use a phenomenon in that the interfacial magnetic anisotropy is generated by bonding between oxygen (O) and Co or Fe.

That is, the magnetic anisotropy energy based on the interfacial magnetic anisotropy can be increased by adding a cap layer of an oxide when the storage layer is located above a tunnel barrier layer and by adding an underlayer of an oxide when the storage layer is located below a tunnel barrier layer.

However, since the oxide cap layer of MgO or the like used in this case is generally an insulating substance having a high resistance and functions as a series resistance overlapped with the change in magnetoresistance obtained by a tunnel magnetoresistance effect generated between a magnetization fixed layer and a storage layer with a tunnel barrier layer provided therebetween, and as a result, the rate of change in resistance of the storage element may be liable to decrease in some cases.

Since the intensity of the reading signal is decreased due to the decrease in the rate of change in resistance, the problems may arise, for example, the circuit is made complicated to overcome the above decrease, or the reading speed is disadvantageously liable to decrease.

Accordingly, in the present disclosure, it was decided to form the storage element as follows.

That is, the storage element according to an embodiment of the present disclosure has a storage layer which has magnetization perpendicular to a film surface and in which the direction of the magnetization is changed in accordance with information.

In addition, the above storage element also has a magnetization fixed layer which has magnetization perpendicular to a film surface used as a base of information stored in the above storage layer.

The storage element further has an insulating layer of a nonmagnetic substance provided between the storage layer and the magnetization fixed layer.

In addition, information is stored by reversing the magnetization of the storage layer using the spin torque magnetization reversal generated by a current flowing in a lamination direction of a layer structure having the storage layer, the insulating layer, and the magnetization fixed layer.

Furthermore, in this storage element, among layers in contact with the above storage layer, a layer provided at a side opposite to the insulating layer is formed of a conductive oxide.

In addition, a storage device according to an embodiment of the present disclosure includes the storage element according to an embodiment of the present disclosure and two types of wires intersecting each other, the storage element is arranged between the two types of wires, and a current is allowed to flow in the storage element along the lamination direction through the two types of wires.

According to the storage element according to an embodiment of the present disclosure, the magnetization fixed layer is provided on the storage layer with the insulating layer (tunnel barrier layer) provided therebetween, and since recording of information is performed by reversing the magnetization of the storage layer using the spin torque magnetization reversal generated by a current flowing along the lamination direction, information can be recorded by allowing a current to flow along the lamination direction. In this case, since the storage layer is a perpendicular magnetic anisotropy film, a writing current necessary to reverse the direction of the magnetization of the storage layer can be reduced.

In addition, the thermal stability of the storage layer can be sufficiently maintained by high magnetic anisotropy energy of the perpendicular magnetic anisotropy film.

Furthermore, in the storage element according to an embodiment of the present disclosure, since a portion (portion other than the insulating layer) other than a ferromagnetic tunnel junction from which a reading signal is obtained includes no layer formed of an insulating substance, the series resistance component having no contribution to the tunnel magnetoresistance effect is reduced, and hence, the decrease in intensity of the reading signal can be effectively suppressed.

In addition, according to the structure of the storage device according to an embodiment of the present disclosure, since a current flows in the storage element along the lamination direction through the two types of wires to cause the spin transfer, information can be recorded by the spin torque magnetization reversal when a current is allowed to flow along the lamination direction of the storage element through the two types of wires.

Furthermore, since the thermal stability of the storage layer can be sufficiently maintained, the information recorded in the storage element can be stably retained, and miniaturization, improvement in reliability, and reduction in power consumption of the storage device can be realized.

According to the present disclosure, since the storage element having perpendicular magnetic anisotropy can be easily obtained, while the thermal stability, which is the information retention capability, is sufficiently ensured, a storage element excellent in property balance can be formed.

Hence, operation errors can be avoided, and operation margins of the storage element can be sufficiently obtained. Therefore, a highly reliable memory which is stably operable can be realized.

In addition, the writing current can be reduced, and the power consumption necessary for writing information in the storage element can also be reduced. Therefore, the power consumption of the whole storage device can be reduced.

Furthermore, since the series resistance component having no contribution to the tunnel magnetoresistance effect can be reduced, and thereby, the decrease in intensity of the reading signal can be suppressed, complication of the circuit and the decrease in reading speed can also be prevented.

DETAILED DESCRIPTION OF EMBODIMENTS

Hereinafter, modes (hereinafter referred to as "embodiments") for carrying out the present disclosure will be described.

Description will be made in the following order.
<1. Outline of storage element according to embodiment>
<2. Structure according to embodiment>
<3. Experiment>
<4. Modification>

1. Outline of Storage Element According to Embodiment

First, the outline of a storage element according to an embodiment of the present disclosure will be described.

According to an embodiment of the present disclosure, by the spin torque magnetization reversal described above, the direction of magnetization of a storage layer of the storage element is reversed to record information.

The storage layer is a ferromagnetic layer formed of a magnetic substance and retains information by a magnetized state (direction of magnetization) of the magnetic substance.

Figure 2:
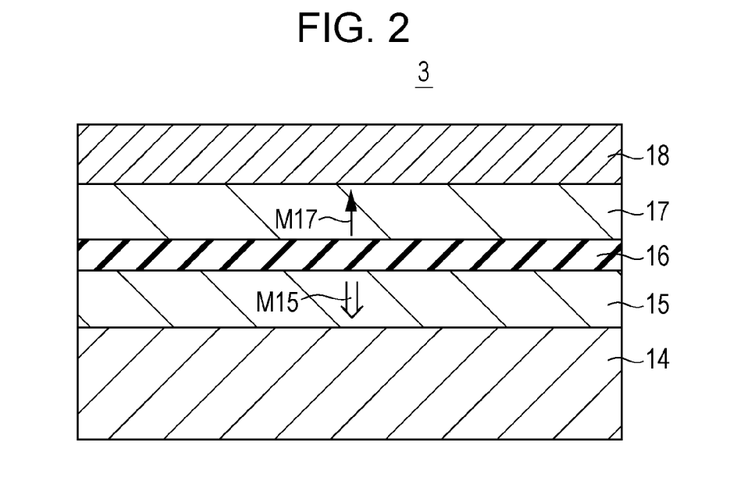
FIG. 2 is a cross-sectional view of a storage element according to an embodiment.

Although described later in detail, the storage element according to the embodiment has a layer structure as shown in FIG. 2 by way of example and has at least two ferromagnetic layers, that is, a storage layer 17 and a magnetization fixed layer 15, and also has an insulating layer 16 as an interlayer provided between the above two magnetic layers.

The storage layer 17 has magnetization perpendicular to a film surface, and the direction of the magnetization is changed in accordance with information.

The magnetization fixed layer 15 has magnetization perpendicular to a film surface used as the base of information stored in the storage layer 17.

The insulating layer 16 contains a nonmagnetic substance and is provided between the storage layer 17 and the magnetization fixed layer 15.

When a spin polarized electron is injected in the layer structure having the storage layer 17, the insulating layer 16, and the magnetization fixed layer 15 along the lamination direction, the direction of the magnetization of the storage layer 17 is changed, and information is recorded in the storage layer 17.

Hereinafter, the spin torque magnetization reversal will be briefly described.

An electron has two types of spin angular momentums. These momentums are temporarily defined as an upward momentum and a downward momentum. In a nonmagnetic substance, the number of electrons each having an upward momentum is the same as that of electrons each having a downward momentum, and in a ferromagnetic substance, the numbers described above are different from each other. In the two ferromagnetic layers, the magnetization fixed layer 15 and the storage layer 17, forming a spin torque-magnetic random access memory (ST-MRAM), when the directions of magnetic moments of the two layers are opposite to each other (hereinafter referred to as "opposite direction state"), the case in which electron are moved to the storage layer 17 from the magnetization fixed layer 15 will be discussed.

The magnetization fixed layer 15 is a fixed magnetic layer in which the direction of the magnetic moment is fixed by a high coercive force.

Electrons passing through the magnetization fixed layer 15 are spin-polarized, that is, the number of upward electrons becomes different from that of downward electrons. When the insulating layer 16, which is a nonmagnetic layer, is formed to have a sufficiently small thickness, before the spin polarization caused by an electron flow passing through the magnetization fixed layer 15 is alleviated and is placed in a non-polarized state (the state in which the number of upward electrons is equal to that of downward electrons) in a general nonmagnetic substance, the electrons reach the storage layer 17.

Since the sign of the degree of spin polarization in the storage layer 17 is opposite to that of the magnetization fixed layer 15, in order to decrease the system energy, some electrons are reversed, that is, the directions of the spin angular momentums thereof are changed. In this case, since the total angular momentum of the system is theoretically conserved, a reaction equivalent to the total of the change in angular momentum caused by the electrons, the directions of which are changed, is also imparted to the magnetic moment of the storage layer 17.

When the current, that is, the number of electrons passing per unit time, is small, the total number of electrons, the directions of which are changed, is also small, and the change in angular momentum generated in the magnetic moment of the storage layer 17 is also small; however, when the current is increased, a large change in angular momentum can be imparted per unit time.

The time change of the angular momentum indicates the torque, and when the torque exceeds a certain threshold value, the magnetic moment of the storage layer 17 starts a precession movement and is stabilized by its uniaxial anisotropy when rotated 180°. That is, the reversal to the same direction state (state in which the directions of magnetic moments are in the same direction) from the opposite direction state occurs.

If the magnetizations are in the same direction state, and a current is conversely supplied so as to send electrons in the direction from the storage layer 17 to the magnetization fixed layer 15, a torque is imparted when electrons spin-reversed by reflection at the magnetization fixed layer 15 enter the storage layer 17, and the magnetic moment can be reversed to the opposite direction state. However, in this case, a current necessary to cause the reversal is larger than that of the case in which the opposite direction state is reversed to the same direction state.

Although it is difficult to intuitively understand the reversal from the same direction state to the opposite direction state of the magnetic moments, it may be understood in such a way that the magnetic moment is not reversed in the magnetization fixed layer 15 since the magnetization thereof is fixed, and in order to conserve the angular momentum of the whole system, the magnetic moment is reversed in the storage layer 17. As described above, recording of "0" or "1" is performed by supplying a current of a certain threshold value or more in the direction from the magnetization fixed layer 15 to the storage layer 17 or in the direction opposite thereto in accordance with a corresponding polarity.

The reading of information is performed by using a magnetoresistance effect as in the case of a related MRAM. That is, a current is supplied in the direction perpendicular to the film surface as in the case of the above recording. In addition, a phenomenon is used in which the electrical resistance of the element is changed according to whether the magnetic moment of the storage layer 17 is in the same direction as that of the magnetization fixed layer 15 or is in the direction opposite thereto.

In this embodiment, between the magnetization fixed layer 15 and the storage layer 17, the insulating layer 16, which is a nonmagnetic and insulating substance, is provided.

Since the insulating layer 16 is provided between the magnetization fixed layer 15 and the storage layer 17 as described above, compared to the case in which, for example, a metal film is provided, a larger reading signal (rate of change in resistance) is obtained, and recording can be performed by a lower current.

The structure in which the insulating layer 16 is provided between the magnetization fixed layer 15 and the storage layer 17 is called a ferromagnetic tunnel junction (Magnetic Tunnel Junction: MTJ).

A current threshold value Ic necessary when the direction of magnetization of a magnetic layer is reversed by the spin torque magnetization reversal is changed whether the magnetization easy axis of the magnetic layer is in an in-plane direction parallel to the surface plane or in a direction perpendicular thereto.

In particular, when the reversal current of an in-plane magnetization type ST-MRAM is represented by Ic_para, the relationship between the reversal direction of magnetization and the reversal current Ic_para is represented as follows.

The same direction state to the opposite direction state . . .
Ic_para=$\{A \cdot \alpha \cdot Ms \cdot V/(g(0)*P)\}(Hk+2\pi Ms)$ The opposite direction state to the same direction state . . .
Ic_para=$-\{A \cdot \alpha \cdot Ms \cdot V/(g(\pi)*P)\}(Hk+2\pi Ms)$ In the above formulas, A indicates a constant, $\alpha$ indicates a damping constant, Ms indicates the saturation magnetization, V indicates an element volume, g(0)P and g($\pi$)P indicate coefficients corresponding to the efficiencies of the spin torques transferred to a facing magnetic layer in the same direction state and in the opposite direction state, respectively, and Hk indicates the magnetic anisotropy (see Nature Materials., 5, 210 (2006)).

On the other hand, when the reversal current of a perpendicular magnetization type ST-MRAM is represented by Ic_perp, the following relationships are obtained.

the same direction state to the opposite direction state . . .
Ic_perp=$\{A \cdot \alpha \cdot Ms \cdot V/(g(0)*P)\}(Hk-4\pi Ms)$ the opposite direction state to the same direction state . . .
Ic_perp=$-\{A \cdot \alpha \cdot Ms \cdot V/(g(\pi)*P)\}(Hk-4\pi Ms)$ In the above formulas, when (Hk−4πMs) of the perpendicular magnetization type is compared to (Hk+2πMs) of the in-plane magnetization type, it can be understood that the perpendicular magnetization type is more suitable to reduce a recording current.

Incidentally, the ST-MRAM has to retain stored information as an effective memory. As the index of the capability to retain information, for example, index Δ (=KV/kBT) of the thermal stability may be mentioned. This Δ is represented by the following formula 1.

$$\Delta = KV/k_B T = Ms \cdot V \cdot H_K \cdot (1/2 k_B T) \quad \text{[Equation 1]}$$

In the above formula, Hk indicates an effective anisotropy field, kB indicates Boltzmann's constant, T indicates the temperature, Ms indicates the saturation magnetization amount, and V indicates the volume of the storage layer.

The influences of shape magnetic anisotropy, induced magnetic anisotropy, crystal magnetic anisotropy, and the like are incorporated in the effective anisotropy field Hk, and when the coherent rotation model in a single domain is assumed, this effective anisotropy field Hk is equivalent to the coercive force.

The index Δ of the thermal stability and the current threshold value Ic have a trade-off relationship in many cases. Therefore, in order to maintain the memory properties, in many cases, these two parameters are requested to be satisfied at the same time.

In a TMR element in which, for example, the thickness of the storage layer 17 is 2 nm and a plane pattern has an approximately oval shape of 100 nm×150 nm, the current threshold value which changes the magnetization state of the storage layer 17 is actually as described below. A + side threshold value +Ic is +0.5 mA, a − side threshold value −Ic is −0.3 mA, and the current density in this case is approximately $3.5 \times 10^6$ A/cm². These approximately coincide with the above formula 1.

On the other hand, in a general MRAM which performs magnetization reversal by a current magnetic field, a writing current of several milliamperes is necessary.

Therefore, it is found that in the case of the ST-MRAM, since the threshold value of the writing current is sufficiently reduced as described above, the ST-MRAM is effective to reduce the power consumption of an integrated circuit.

In addition, since magnetic field generating wires used for a general MRAM are not necessary for the ST-MRAM, the ST-MRAM is also advantageous in terms of the degree of integration as compared to a general MRAM.

Since a current is directly supplied in a storage element for information writing (recording) in the case of the ST-MRAM which performs the spin torque magnetization reversal, in order to select a memory cell which performs writing, the storage element is connected to a selection transistor to form the memory cell.

In this case, a current flowing in the storage element is restricted by a current (saturation current of the selection transistor) which is allowed to flow in the selection transistor.

In order to reduce a recording current, the perpendicular magnetization type is preferably used as described above. In addition, since a perpendicular magnetic anisotropy film is generally able to have a magnetic anisotropy higher than that of an in-plane magnetic anisotropy film, the Δ described above can be preferably maintained high.

As a magnetic material having perpendicular anisotropy, for example, there may be mentioned several types of materials, such as rare earth-transition metal alloys (TbCoFe and the like), metal multilayer films (Co/Pd multilayer film and the like), ordered alloys (FePt and the like), and composite materials each using interfacial magnetic anisotropy between an oxide and a magnetic metal (Co/MgO and the like). Among these mentioned above, since the rare earth-transition metal alloy loses the perpendicular magnetic anisotropy when diffused and crystallized by heating, this material is not preferable as a material for the ST-MRAM. In addition, it has been well understood that the metal multilayer film is diffused by heating, and the perpendicular magnetic anisotropy thereof is degraded thereby. In addition, since the perpendicular magnetic anisotropy is only obtained in the (111) orientation of the face-centered cubic crystal, it becomes difficult to realize the (001) orientation necessary for MgO and a high polarizability layer arranged adjacent thereto, which is formed, for example, of Fe, CoFe, or CoFeB.

In addition, since an L10 ordered alloy is stable at a high temperature and shows the perpendicular magnetic anisotropy in the (001) orientation, the problems as described above may not arise. However, since it is necessary to perform heating at a high temperature of 500° C. or more in manufacturing or to perform a heating treatment at a high temperature of 500° C. or more after manufacturing for regular arrangement of atoms, an unfavorable diffusion in another portion of the laminate film, such as the insulating layer 16 (tunnel barrier layer), and/or increase in interface roughness may occur in some cases.

On the other hand, by the composite material using interfacial magnetic anisotropy, that is, by a Co-based or a Fe-based material laminated on a tunnel barrier layer, such as MgO, any problems described above are not likely to occur, and hence, this composite material is expected as a promising storage layer material of the ST-MRAM.

Although it is believed that the perpendicular magnetic anisotropy based on the interfacial magnetic anisotropy is generated when oxygen contained in the oxide is bonded to Co or Fe at the interface, compared to the crystal magnetic anisotropy of an ordered alloy and the single ion anisotropy of a rare earth element, the anisotropy energy itself is low and is also disadvantageously decreased as the magnetic layer thickness is increased.

In order to solve the above problem, the present applicant has already proposed the structure in which oxides are arranged at two sides of a magnetic metal to increase the number of interfaces (Japanese Patent Application No. 2010-201526). In particular, for example, the structure is as described below.

substrate/underlayer/magnetization fixed layer/MgO (tunnel barrier layer)/storage layer/oxide cap layer By the structure as described above, as the interface contributing to the interfacial magnetic anisotropy, besides the interface between the storage layer/MgO (tunnel barrier layer), one interface between the storage layer/the oxide cap layer is additionally obtained, and hence the anisotropy of the storage layer can be effectively increased.

However, since the oxide cap layer (such as MgO) used for this structure is generally formed of an insulating substance, the resistance thereof is high, and this resistance is overlapped with the change in magnetoresistance obtained by the tunnel magnetoresistance effect between the magnetization fixed layer and the storage layer, so that the rate of change in resistance may be decreased in some cases.

Accordingly, the present applicant found out the structure in which one of the layers in contact with the storage layer provided at a side opposite to the insulating layer (tunnel barrier layer) is formed from a conductive oxide. In particular, in the case in which the structural example shown in FIG. 2 is used, a cap layer 18 is formed of an oxide having a high electrical conductivity.

By the structure as described above, a series resistance component which has no contribution to the tunnel magnetoresistance effect and which is overlapped with the resistance of a tunnel barrier portion (insulating layer 16) generating the tunnel magnetoresistance effect can be reduced, and the decrease in tunnel magnetoresistance effect can be effectively suppressed.

In addition, the magnetoresistance effect is reflected to the intensity of the reading signal. Since the decrease in magnetoresistance effect can be suppressed as described above, the case in which the circuit is made complicated in order to prevent the decrease in signal intensity and/or the case in which the reading speed is decreased can be avoided.

In this embodiment, the storage layer 17 is a perpendicular magnetic anisotropy film including an alloy region which contains at least one of Co and Fe.

Furthermore, in consideration of the saturation current value of the selection transistor, the insulating layer 16 formed of an insulating substance is provided between the storage layer 17 and the magnetization fixed layer 15 as a nonmagnetic layer to form a magnetic tunnel junction (MTJ) element.

By forming the magnetic tunnel junction (MTJ) element using a tunnel insulating layer, compared to the case in which a giant magnetoresistance effect (GMR) element is formed using a nonmagnetic conductive layer, the rate of change in magnetoresistance (hereinafter referred to as "MR ratio" in some cases) can be increased, and the intensity of the reading signal can be increased.

In addition, in particular, by using magnesium oxide (MgO) as a material of the insulating layer 16 functioning as this tunnel insulating layer, the rate of change in magnetoresistance (MR ratio) can be increased.

In general, the efficiency of spin transfer is dependent on the MR ratio and is improved as the MR ratio is increased, and the magnetization reversal current density can be reduced. Therefore, when magnesium oxide is used as a material of the insulating layer 16, and the above storage layer 17 is also used together therewith, the writing current threshold value by the spin torque magnetization reversal can be reduced, and information can be written (recorded) by a small current. In addition, the intensity of the reading signal can also be increased.

As described above, while the MR ratio (TMR ratio) is ensured, the writing current threshold value by the spin torque magnetization reversal can be reduced, and information can be written (recorded) by a small current. In addition, the intensity of the reading signal can be increased.

When the insulating layer 16 is formed from a magnesium oxide (MgO) film, it is more preferable that the MgO film is crystallized and that the crystal orientation thereof is maintained in the (001) direction.

In this embodiment, besides the structure formed from magnesium oxide, the insulating layer 16 functioning as a tunnel barrier layer may be formed, for example, by using various types of insulating substances, such as aluminum oxide, aluminum nitride, $SiO_2$, $Bi_2O_3$, $MgF_2$, CaF, $SrTiO_2$, $AlLaO_3$, and Al—N—O, a dielectric substance, and a semiconductor.

In addition, an areal resistance of the insulating layer 16 is necessarily controlled to approximately several tens of $\Omega \cdot \mu m^2$ or less in order to obtain a current density to reverse the direction of magnetization of the storage layer 17 by the spin torque magnetization reversal.

In order to control the areal resistance of the insulating layer 16 formed from an MgO film in the above range, the thickness thereof is necessarily set to 1.5 nm or less.

In the case of this embodiment described above, the cap layer 18 is arranged adjacent to the storage layer 17, and a conductive oxide is used for this cap layer 18.

As the conductive oxide, for example, $ReO_3$, $RuO_2$, $SnO_2$, $TiO_2$, $LiTi_2O_4$, $LiV_2O_4$, and $Fe_3O_4$ may be used, and in addition, an oxide having insulating properties at ordinary condition may also be used when conductivity is imparted thereto by forming oxygen defects or doping a different element.

In addition, in order to easily reverse the direction of the magnetization of the storage layer 17 by a small current, the size of the storage element is preferably decreased.

The area of the storage element is preferably set to 0.01 $\mu m^2$ or less.

In this embodiment, elements other than Co and Fe may also be added to the storage layer 17.

By addition of a different type of element, advantages, such as improvement in thermal resistance by diffusion prevention, increase in magnetoresistance effect, and increase in withstand voltage caused by planarization, can be obtained. As a material of the addition element in this case, for example, B, C, N, O, F, Mg, Si, P, Ti, V, Cr, Mn, Ni, Cu, Ge, Nb, Mo, Ru, Rh, Pd, Ag, Ta, W, Ir, Pt, Au, Zr, Hf, Re, Os, or an alloy thereof may be used.

The storage layer 17 according to an embodiment of the present disclosure may also be formed by directly laminating other ferromagnetic layers having different compositions. In addition, a ferromagnetic layer and a soft magnetic layer may be laminated to each other, or a plurality of ferromagnetic layers may be laminated with at least one of a soft magnetic layer and a nonmagnetic layer provided therebetween.

In particular, when a plurality of ferromagnetic layers is laminated with at least one nonmagnetic layer provided therebetween, since the intensity of the interaction between the ferromagnetic layers can be adjusted, even if the size of the storage element is decreased to a submicron order or less, an effect of suppressing increase in magnetization reversal current can be obtained. As a material of the nonmagnetic layer in this case, for example, Ru, Os, Re, Ir, Au, Ag, Cu, Al, Bi, Si, B, C, Cr, Ta, Pd, Pt, Zr, Hf, W, Mo, Nb, or an alloy thereof may be used.

Only by a ferromagnetic layer or by using antiferromagnetic coupling between an antiferromagnetic layer and a ferromagnetic layer, the magnetization fixed layer 15 can be formed so that the direction of the magnetization is fixed.

In addition, the magnetization fixed layer 15 can be formed of a single ferromagnetic layer or a laminate ferri-pinned structure in which ferromagnetic layers are laminated with a nonmagnetic layer provided therebetween.

As a material of the ferromagnetic layer forming the magnetization fixed layer 15 having a laminate ferri-pinned structure, for example, Co, CoFe, and CoFeB may be used. In addition, as a material of the nonmagnetic layer, for example, Ru, Re, Ir, and Os may be used.

As a material of the antiferromagnetic layer, magnetic substances, such as an FeMn alloy, a PtMn alloy, a PtCrMn alloy, an NiMn alloy, an IrMn alloy, NiO, and $Fe_2O_3$, may be mentioned.

By addition of nonmagnetic elements, such as Ag, Cu, Au, Al, Si, Bi, Ta, B, C, O, N, Pd, Pt, Zr, Hf, Ir, W, Mo, and Nb, to these magnetic substances mentioned above, the magnetic properties can be adjusted, and/or various other physical properties, such as the crystal structure, the crystallinity, and the stability of the substance, can also be adjusted.

The thickness of the magnetization fixed layer 15 and that of the storage layer 17 are each preferably in a range of 0.5 nm to 30 nm.

The remaining structure of a storage element 3 can be formed similar to that of a common structure of a storage element which records information by the spin torque magnetization reversal.

2. Structure According to Embodiment

Next, concrete structures of a storage element and a storage device according to an embodiment will be described.

Figure 1:
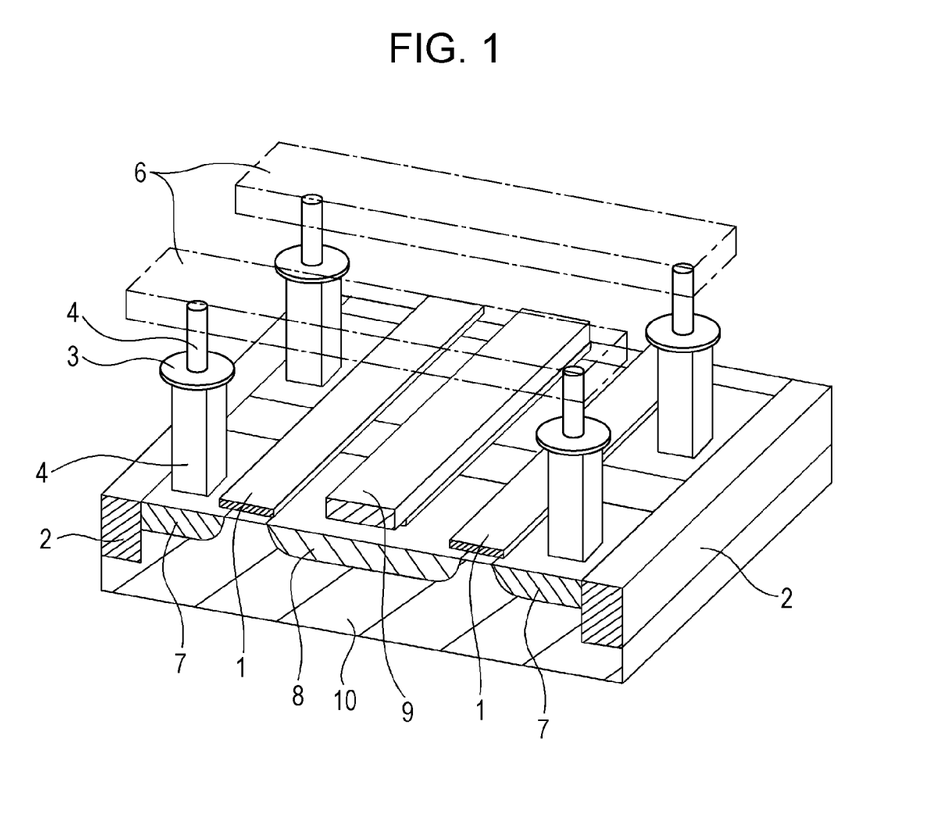
FIG. 1 is a schematic structural view (perspective view) of a storage device (memory device) according to an embodiment.

FIG. 1 shows a schematic structural view (perspective view) of a memory device as a storage device according to one embodiment of the present disclosure.

In this memory device, in the vicinity of an intersection of two types of address wires (such as a word line and a bit line) which orthogonally intersect each other, a storage element 3 which can retain information by a magnetized state is arranged.

That is, a drain region 8, a source region 7, and a gate electrode 1, which form a selection transistor for selecting each memory cell, are formed in a portion isolated by an element isolation layer 2 of a semiconductor base 10, such as a silicon substrate. Among those mentioned above, the gate electrode 1 also functions as an address wire (such as a word line) extending perpendicular to the plane of the figure.

The drain region 8 is formed in common for selection transistors located at right and left sides in the figure, and a wire 9 is connected to this drain region 8.

In addition, the storage element 3 is arranged between the source region 7 and the other wire (such as a bit line) 6 arranged thereabove to extend in a right-to-left direction in the figure.

This storage element 3 is arranged in the vicinity of an intersection between the two types of address wires 1 and 6.

In addition, the storage element 3 is connected to the bit line 6 and the source region 7 through top and bottom contact layers 4, respectively.

Thereby, through the two types of address wires 1 and 6, a current is allowed to flow in the storage element 3 along a top-to-bottom direction, so that the direction of the magnetization of the storage layer can be reversed by the spin torque magnetization reversal.

FIG. 2 is a cross-sectional view of the storage element 3 according to this embodiment.

As shown in FIG. 2, this storage element 3 is formed of a storage layer 17 in which the direction of magnetization M17 is reversed by the spin torque magnetization reversal and a magnetization fixed layer 15 provided under the storage layer 17.

In an ST-MRAM, the relative angle between the magnetization M17 of the storage layer 17 and magnetization M15 of the magnetization fixed layer 15 prescribes information "0" or "1".

Between the storage layer 17 and the magnetization fixed layer 15, an insulating layer 16 to be used as a tunnel barrier layer (tunnel insulating layer) is formed, and an MTJ element is formed by the storage layer 17 and the magnetization fixed layer 15.

In addition, an underlayer 14 is formed at a lower side of the magnetization fixed layer 15, and a cap layer 18 is formed at an upper side of the storage layer 17.

In this embodiment, as described above, the storage layer 17 is a perpendicular magnetic anisotropy film including an alloy region which contains at least one of Co and Fe.

In addition, in this embodiment, the cap layer 18 arranged adjacent to the storage layer 17 is formed of a conductive oxide.

Furthermore, in this embodiment, the insulating layer 16 is formed from a magnesium oxide layer to increase the rate of change in magnetoresistance (MR ratio).

When the MR ratio is increased as described above, the efficiency of spin injection can be improved, and a current density necessary to reverse the direction of the magnetization M17 of the storage layer 17 can be reduced.

The storage element 3 according to this embodiment can be manufactured by the steps of continuously forming layers from the underlayer 14 to the cap layer 18 in a vacuum apparatus, and then forming a pattern of the storage element 3 by etching or the like.

Since the storage layer 17 is a perpendicular magnetic anisotropy film, the storage element 3 according to this embodiment can reduce a writing current necessary to reverse the direction of the magnetization M17 of the storage layer 17.

In addition, since the cap layer 18 laminated on the storage layer 17 is a conductive substance although being an oxide, the decrease in the magnetoresistance effect can be effectively suppressed.

As described above, since the thermal stability which is the information retention capability can be sufficiently ensured, a storage element excellent in property balance can be realizable.

Accordingly, operation errors can be avoided, and operation margins of the storage element 3 can be sufficiently obtained, so that the storage element 3 can be stably operated. Hence, a highly reliable memory which can be stably operated is realized.

In addition, the writing current can be reduced, and the power consumption necessary for writing in the storage element 3 can also be reduced. Therefore, the power consumption of the whole memory device can be reduced.

Furthermore, according to this embodiment, since the cap layer 18 is formed of an oxide having a high electrical conductivity, the series resistance which has no contribution to the magnetoresistance effect and which is overlapped with the resistance of a tunnel barrier portion generating the tunnel magnetoresistance effect can be reduced, and the decrease in the tunnel magnetoresistance effect can be suppressed.

Since the magnetoresistance effect is reflected to the intensity of the reading signal, when the decrease in the magnetoresistance effect is suppressed, the case can be prevented in which by the decrease in signal intensity, the circuit is made complicated and/or the reading speed is decreased.

In addition, a memory device of the structure shown in FIG. 1 which includes the storage element 3 shown in FIG. 2 can be advantageously manufactured by using a general semiconductor MOS formation process.

Accordingly, the memory device according to this embodiment can be used as a general purpose memory.

Figure 3:
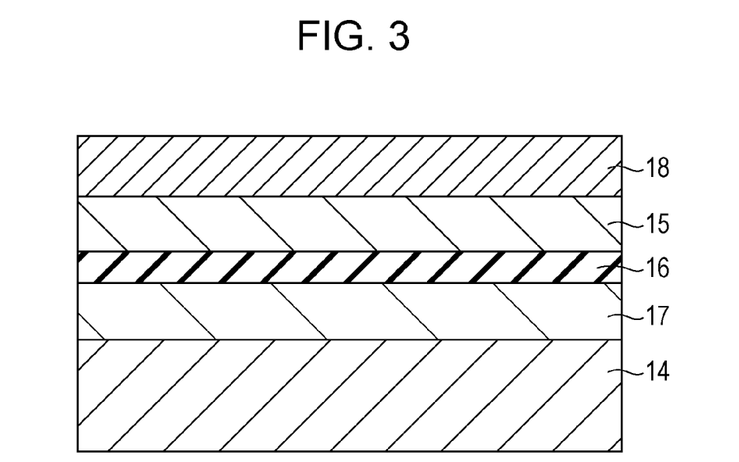
FIG. 3 is a cross-sectional view of a storage element in which a storage layer is arranged at a lower side of a magnetization fixed layer.

Although the structure in which the cap layer 18, the storage layer 17, the insulating layer 16, the magnetization fixed layer 15, and the underlayer 14 are arranged in this order from an upper layer side is described above by way of example as the structure of the storage element, as the storage element according to an embodiment of the present disclosure, as shown in FIG. 3, the structure in which the storage layer 17 is arranged at a lower side of the magnetization fixed layer 15 may also be formed.

In particular, the structure is formed such that the cap layer 18, the magnetization fixed layer 15, the insulating layer 16, the storage layer 17, and the underlayer 14 are arranged in this order from an upper layer side.

In this case, the enhancement of the perpendicular magnetic anisotropy of the storage layer 17 should be performed by the underlayer 14 (strictly speaking, by the interface between the storage layer 17 and the underlayer 14). Hence, in this case, the underlayer 14 is formed of the conductive oxide described above.

3. Experiment

In the structure of the storage element 3 described with reference to FIG. 2, by particularly selecting a material forming the cap layer 18, a sample of the storage element 3 was formed, and the properties thereof were investigated.

Although a switching semiconductor circuit and the like were mounted in an actual memory device besides the storage element 3 as shown in FIG. 1, in this experiment, in order to investigate the magnetization reversal properties of the storage layer 17 located adjacent to the cap layer 18, a wafer in which only a storage element portion was formed was used for investigation.

A thermal oxide film having a thickness of 300 nm was formed on a silicon substrate having a thickness of 0.725 mm, and the storage element 3 of the structure shown in FIG. 2 was formed on the thermal oxide film.

In particular, in the storage element 3 of the structure shown in FIG. 2, materials and thicknesses of individual layers were selected as follows.

Underlayer 14 . . . laminate film of a Ta film having a thickness of 10 nm and an Ru film having a thickness of 25 nm magnetization fixed layer 15 . . . CoFeB film having a thickness of 2.5 nm Insulating layer 16 . . . magnesium oxide film having a thickness of 0.9 nm storage layer 17 . . . CoFeB/Ta/CoFeB laminate film Cap layer 18 . . . MgO (storage element 3A) or CoTiO (storage element 3B)

In this experiment, the storage element 3A and the storage element 3B are represented by "sample 3A" and "sample 3B", respectively.

In addition, in the above film structure, the ferromagnetic layer of the storage layer 17 was CofeB: 0.9 nm/Ta: 0.3 nm/CoFeB: 0.9 nm, and the composition of CoFeB was Co16%-Fe64%-B20%.

The insulating layer 16 formed of a magnesium oxide (MgO) film and the cap layer 18 formed of MgO or CoTiO were obtained by using a RF magnetron sputtering method, and the other films were formed by using a DC magnetron sputtering method.

Furthermore, in each of the samples 3A and 3B, after the individual layers were formed, a heat treatment was performed at 350° C. for 2 hours in a magnetic field heat treatment furnace.

In the sample 3A, MgO was an insulating substance, and in the sample 3B, CoTiO was a conductor (semiconductor) having a resistivity of approximately 0.1 Ω·cm at room temperature.

Figure 4A:
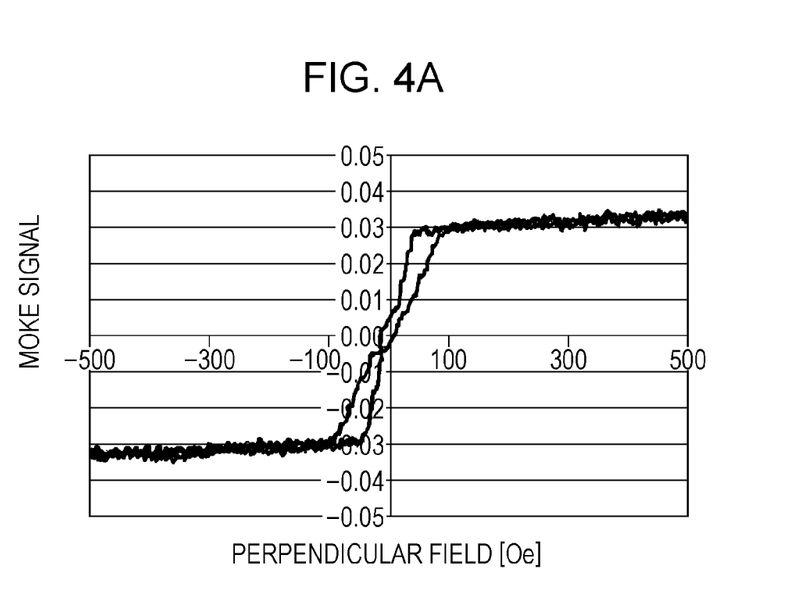
FIG. 4A is a graph showing the result of magnetic properties of a sample using an insulating oxide (MgO) as a cap layer, obtained by investigation using the magneto-optical Kerr effect.
Figure 4B:
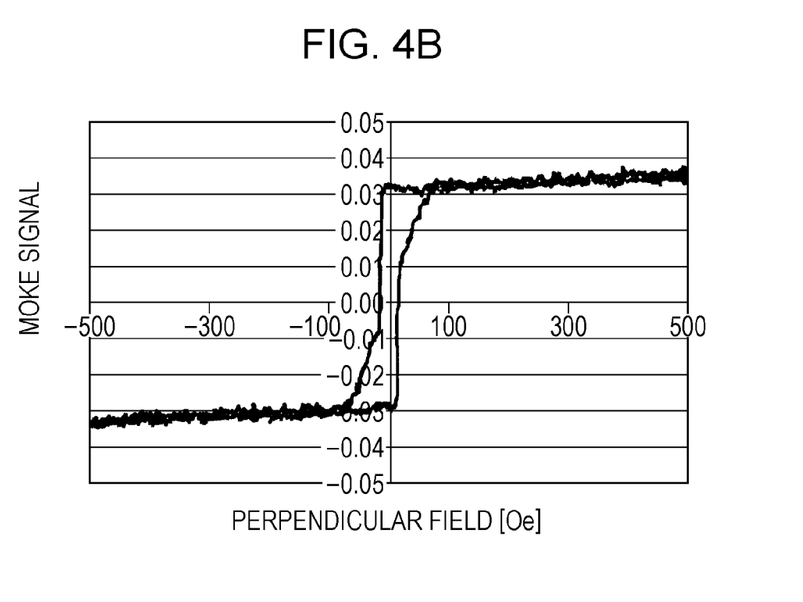
FIG. 4B is a graph showing the result of magnetic properties of a sample using a conductive oxide (CoTiO) as a cap layer, obtained by investigation using the magneto-optical Kerr effect.

The results of magnetic properties of the samples 3A and 3B obtained by investigation using the magneto-optical Kerr effect are shown in FIGS. 4A and 4B.

FIG. 4A shows the result of the sample 3A, and FIG. 4B shows the result of the sample 3b.

In each of FIGS. 4A and 4B, the horizontal axis indicates a magnetic field applied in a direction perpendicular to the film surface, and the vertical axis indicates the Kerr rotation angle. As a limit magnetic field (coercive force) is higher in which even when the magnetic field in the direction perpendicular to the film surface is decreased from a positive value to 0, a positive Kerr rotation angle can be maintained and in which even when a negative magnetic field is further applied, a positive Kerr rotation angle can also be maintained, the perpendicular magnetic anisotropy is increased.

According to FIGS. 4A and 4B, it is found that the sample 3B has perpendicular magnetic anisotropy superior to that of the sample 3A. That is, it is found that even if the cap layer 18 is formed of a conductive oxide, the perpendicular magnetic anisotropy is obtained, and that in some cases, the perpendicular magnetic anisotropy thus obtained may be superior to that obtained when the cap layer 18 is formed of an insulating material.

When the storage elements are formed using the samples 3A and 3B, a sufficiently low recording current and sufficiently high heat stability as the ST-MRAM can be obtained in both cases, and in particular, since the cap layer 18 of the sample 3B has electrical conductivity, a high magnetoresistance effect is obtained as compared to that of the sample 3A.

The reason for this will be described below.

Figure 5:
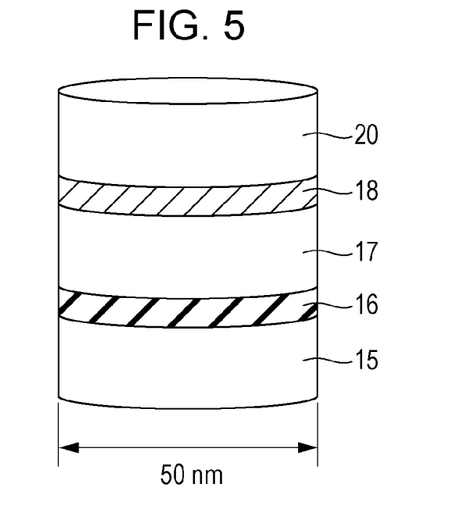
FIG. 5 is a view showing one example of a cylindrical tunnel junction element used for discussion on the reason a higher magnetoresistance effect is obtained when a conductive oxide is used for a cap layer.

First, the case in which a cylindrical tunnel junction element having a diameter of 50 nm is formed as the storage element will be discussed. As shown in FIG. 5, the layer structure of the above element is formed of a protective layer 20, the cap layer 18, the storage layer 17, the insulating layer 16, and the magnetization fixed layer 15 in this order from an upper layer side.

Since the magnetization fixed layer 15, the storage layer 17, and the protective layer 20 are each formed of a metal, and the insulating layer 16 and the cap layer 18 are each formed of an oxide, the resistance of the storage element is determined by the resistance of the insulating layer 16 and that of the cap layer 18.

As for the resistance of the insulating layer 16 and that of the cap layer 18, since the thickness thereof is very small so that a tunnel current flows, introduction of the concept of areal resistance (RA) is convenient. This areal resistance is represented by the resistance multiplied by the area, and as the unit thereof, [Ω·μm$^2$] is used.

The areal resistance of the insulating layer 16 and that of the cap layer 18 are each determined by the thickness and the values extracted from the material thereof, and the actual resistance is decreased as the area is increased and is increased as the area is decreased.

The reading signal of the ST-MRAM is increased when the TMR ratio is high, that is, when the rate of change in resistance is high between the case in which the direction of the magnetization of the storage layer 17 is in the same direction as that of the magnetization fixed layer 15 and the case in which the direction of the magnetization of the storage layer 17 is in the direction opposite to that of the magnetization fixed layer 15 (that is, between the "0" state and the "1" state). When the resistance of the storage element is dominantly determined by the resistance of the insulating layer 16, the change in resistance between the "0" state and the "1" state is determined by the materials of the insulating layer 16, the magnetization fixed layer 15, and the storage layer 17 and is represented by the following formula.

$$TMR(\%) = 100 \cdot (RA_H - RA_L)/RA_L$$

In the above formula, the areal resistance in the same direction state is represented by $RA_L$, and the areal resistance in the opposite direction state is represented by $RA_H$. However, as has thus been described in the present disclosure, in the case in which an oxide is used for the cap layer 18 in order to induce the perpendicular magnetic anisotropy, when the oxide has insulating properties, resistance $RA_{cap}$ having no contribution to the change in resistance is added in series. As a result, the rate of change in resistance is represented by the following formula.

$$TMR(\%) = 100 \cdot (RA_H - RA_L)/(RA_L + RA_{cap})$$

That is, the rate of change in resistance is decreased as $RA_{cap}$ is increased.

Furthermore, samples 3C, 3D, and 3E are compared to each other. In each of these samples 3C, 3D, and 3E, the thickness of MgO forming the insulating layer 16 was set to 0.9 nm. As the material of the cap layer 18, Ta (metal), MgO (insulating substance), and CoTiO (semiconductive conductor), each having a thickness of 0.9 nm, were used for the samples 3C, 3D, and 3E, respectively. In addition, in each of the samples described above, Ru having a thickness of 5 nm was used for the protective layer 20. The remaining structures of these samples were the same as those of the samples 3A and 3B.

When RA and the rate of TMR change of the sample 3C were measured, $RA_L$ was $20\,\Omega\cdot\mu m^2$, $RA_H$ was $40\,\Omega\cdot\mu m^2$, and TMR was 100%. In the sample 3C, the resistance is dominantly determined by MgO forming the insulating layer 16, and $RA_L$ is determined by MgO, which is the insulating layer 16, having a thickness of 0.9 nm. In this case, $RA_{cap}$ can be regarded as zero.

In the sample 3D, since the cap layer 18 is formed of MgO having a thickness of 0.9 nm, the cap layer 18 also has an equivalent RA. That is, $RA_{cap}$ was $20\,\Omega\cdot\mu m^2$, and hence TMR was decreased to 50%.

On the other hand, CoTiO used for the sample 3E showed semiconductive conduction properties and had a resistivity of $0.1\,\Omega\cdot cm$ at room temperature, which was a value between MgO functioning as an insulating substance and Ta functioning as a metal. However, since the film thickness was small such as 0.9 nm, it was found by a simple calculation that $RA_{cap}$ of CoTiO was $0.9\,\Omega\cdot\mu m^2$. In this case, TMR was 95%.

It is found that compared to the sample 3C, the TMR ratio of the sample 3D using MgO for the cap layer 18 was decreased by half, and on the other hand, the TMR ratio of the sample 3E using CoTiO for the cap layer 18 was hardly decreased. According to the present disclosure, although it is necessary to use an oxide for the cap layer 18, since CoTiO, which is an oxide having a lower resistivity, is used for the cap layer 18, the decrease in TMR ratio can be suppressed.

Of course, although a particular value of the TMR ratio necessary for a circuit configuration is determined, for example, by the performance of a reading circuit, since a high TMR ratio can be ensured by using CoTiO, it is apparent that the circuit design can be advantageously made easier.

In addition, although there may be mentioned a method in which $RA_{cap}$ is decreased by decreasing the thickness of the cap layer 18 formed of MgO to suppress the decrease in TMR ratio, the decrease in thickness of an oxide is limited from a manufacturing point of view, and if the thickness is excessively decreased, variation in resistance may occur thereby. That is, the structure in which the effect can be obtained by using a conductive oxide, such as CoTiO, having a controllable thickness of approximately 0.9 mm is also apparently advantageous.

As the conductive oxide forming the cap layer 18, CoTiO was used as described above; however, of course, the conductive oxide is not limited thereto. Important points of the conductive oxide are that in order to induce the perpendicular anisotropy, an oxygen atom is contained, and that in order not to remarkably decrease the TMR ratio of the storage element, the resistibility is a certain value or less.

The range of the resistivity necessary for the cap layer 18 is determined by combination with RA of the insulating layer 16.

Although being optimized by the area of an element and the resistance of a transistor in accordance with the generation of the device, RA of the insulating layer 16 is at most $20\,\Omega\cdot\mu m^2$.

Although depending on the circuit configuration, the permissible series resistance of the cap layer 18 is approximately 10% of that of the insulating layer 16, and hence, $RA_{cap}$ is necessary to be $2\,\Omega\cdot\mu m^2$ or less. When it is intended to realize this value by a film thickness of 0.5 nm or more for the manufacturing stability, by a simple calculation, the resistivity of the cap layer 18 may be set to approximately $0.4\,\Omega\cdot cm$ or less.

Figure 6:
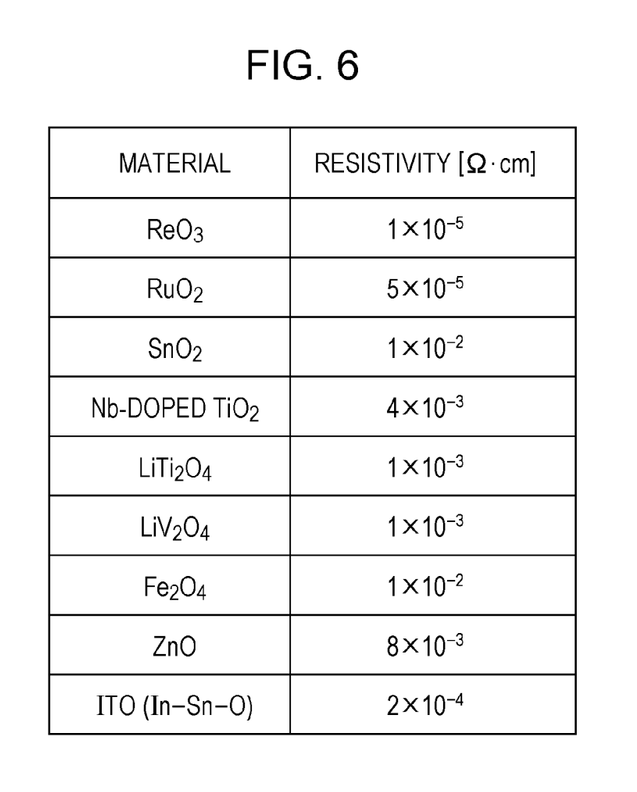
FIG. 6 is a table showing materials each satisfy resistivity condition necessary for the cap layer.

In this experiment, as materials which satisfy the conditions of the resistivity as described above, for example, oxides as shown in FIG. 6, each of which is formed by an appropriate manufacturing method, may be mentioned.

However, even when a material, which is generally regarded as an insulating substance, is used as a base material, if electrical conductivity is imparted thereto by doping, diffusion mixing, and the like, the conditions of the above resistivity can be satisfied. For example, when a compound prepared by mutual diffusion between MgO and Ta so that the resistance is decreased to have a resistivity of $0.4\,\Omega\cdot cm$ or less is used, the advantages of the present disclosure can be sufficiently obtained.

4. Modification

Heretofore, although the embodiments of the present disclosure have been described, the present disclosure is not limited to the film structure of the storage element 3 described above, and various film structures may also be used. That is, various structures may be formed without departing from the scope of the present disclosure.

For example, although the case is described above in which instead of using a single layer structure, the magnetization fixed layer 15 may be formed to have a laminate ferri-pinned structure of the two ferromagnetic layers and a nonmagnetic layer, in this case, the structure may also be formed by further adding an antiferromagnetic film to the laminate ferri-pinned structural film.

The present disclosure contains subject matter related to that disclosed in Japanese Priority Patent Application JP 2011-001920 filed in the Japan Patent Office on Jan. 7, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A storage element comprising:

a storage layer which has magnetization perpendicular to an upper film surface thereof, a direction of the magnetization being dependent upon information stored therein;

a magnetization fixed layer which has magnetization perpendicular to an upper film surface thereof, a direction of the magnetization of the magnetization fixed layer being fixed;

a nonmagnetic insulating layer between the storage layer and the magnetization fixed layer, the insulating layer being on a first side of the storage layer;

a conductive oxide layer on a second side of the storage layer, wherein,
the direction of the magnetization of the storage layer is reversible using a spin torque magnetization reversal generated by a current flowing through the storage layer, the insulating layer, and the magnetization fixed layer to store information in a direction perpendicular to the upper film surface of the storage layer.

2. The storage element according to claim 1, wherein the storage layer includes an alloy region containing at least one of Fe and Co.

3. The storage element according to claim 1, wherein the conductive oxide has a resistivity of 0.4 Ωcm or less.

4. The storage element according to claim 1, wherein the conductive oxide contains one of $ReO_3$, $RuO_2$, $SnO_2$, $TiO_2$, CoTiO, $LiT_2O_4$, $LiV_2O_4$, and $Fe_3O_4$.

5. The storage element according to claim 1, wherein the insulating layer contains an oxide.

6. The storage element according to claim 1, wherein the insulating layer contains MgO.

7. The storage element according to claim 1, further comprising an underlayer,
wherein:
the conductive oxide layer is a cap layer of the storage element, and
the underlayer, the magnetization fixed layer, the insulating layer, the storage layer, and the cap layer are laminated in this order.

8. The storage element according to claim 1, further comprising a cap layer,
wherein:
the conductive oxide layer is an underlayer of the storage element, and
the underlayer, the storage layer, the insulating layer, the magnetization fixed layer, and the cap layer are laminated in this order.

9. A storage device comprising:
a storage element which retains information by means of a magnetized state of a magnetic substance; and
first and second wires connect to opposite sides of the storage element,
wherein the storage element includes:
a storage layer which has magnetization perpendicular to an upper film surface thereof, a direction of the magnetization being dependent upon information stored therein;
a magnetization fixed layer which has magnetization perpendicular to an upper film surface thereof, a direction of the magnetization of the magnetization fixed layer being fixed; and
a nonmagnetic insulating layer between the storage layer and the magnetization fixed layer, the insulating layer being on a first side of the storage layer,
a conductive oxide layer on a second side of the storage layer,
the direction of the magnetization of the storage layer is reversible using a spin torque magnetization reversal generated by a current flowing through the storage layer, the insulating layer, and the magnetization fixed layer in a direction perpendicular to the upper film surface of the storage layer,
the storage element is arranged between the first and second wires, and
the current flows in the storage element through the first and second wires.

* * * * *